(12) United States Patent
Pineda De Gyvez et al.

(10) Patent No.: US 7,457,971 B2
(45) Date of Patent: Nov. 25, 2008

(54) MONITORING AND CONTROLLING POWER CONSUMPTION IN A SEQUENTIAL LOGIC CIRCUIT

(75) Inventors: Jose de Jesus Pineda De Gyvez, Eindhoven (NL); Josep Rius Vazquez, Barcelona (ES)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/558,090

(22) PCT Filed: May 17, 2004

(86) PCT No.: PCT/IB2004/050720

§ 371 (c)(1), (2), (4) Date: Nov. 23, 2005

(87) PCT Pub. No.: WO2004/107144

PCT Pub. Date: Dec. 9, 2004

(65) Prior Publication Data

US 2006/0248354 A1 Nov. 2, 2006

(30) Foreign Application Priority Data

May 27, 2003 (EP) .................................. 03101534

(51) Int. Cl.
*G06F 1/00* (2006.01)
*G06F 1/26* (2006.01)
*G06F 1/32* (2006.01)

(52) U.S. Cl. ...................... 713/300; 713/320; 713/322
(58) Field of Classification Search .................. 713/300, 713/320, 322
See application file for complete search history.

(56) References Cited

U.S. PATENT DOCUMENTS

| | | | | |
|---|---|---|---|---|
| 5,339,445 A | * | 8/1994 | Gasztonyi | 713/324 |
| 5,457,790 A | * | 10/1995 | Iwamura et al. | 711/167 |
| 5,498,988 A | * | 3/1996 | Reyes et al. | 327/199 |
| 5,667,537 A | * | 9/1997 | Richiardone et al. | 29/623.2 |
| 5,719,800 A | * | 2/1998 | Mittal et al. | 713/321 |
| 5,781,783 A | * | 7/1998 | Gunther et al. | 713/320 |
| 5,815,725 A | | 9/1998 | Feierbach | |
| 5,954,820 A | * | 9/1999 | Hetzler | 713/323 |
| 6,101,609 A | * | 8/2000 | Kawasaka | 713/322 |
| 6,212,641 B1 | * | 4/2001 | Frank et al. | 713/323 |
| 6,307,281 B1 | * | 10/2001 | Houston | 307/31 |
| 6,822,478 B2 | * | 11/2004 | Elappuparackal | 326/46 |
| 2004/0225902 A1 | * | 11/2004 | Cesare et al. | 713/300 |
| 2006/0119991 A1 | * | 6/2006 | Garg et al. | 361/18 |

\* cited by examiner

*Primary Examiner*—Thomas Lee
*Assistant Examiner*—Ji H Bae

(57) ABSTRACT

The present invention relates to an electronic circuit, apparatus and method for monitoring and controlling power consumption. Accordingly, there is provided an electronic circuit, apparatus and method that includes one or more sequential logic elements (12) that are capable of receiving a clock signal (CLK) and an input signal (I) and providing an output signal (O). The sequential logic element (12) further comprises circuitry (20) for monitoring the input and output signals (I, O), and providing a control signal (CS) in response to the input and output signals (I, O), wherein the IC's power consumption is operatively controllable in response to the control signal.

6 Claims, 9 Drawing Sheets

MONITORING AND CONTROLLING POWER CONSUMPTION IN A SEQUENTIAL LOGIC CIRCUIT

The present invention relates to an electronic circuit that includes at least one sequential logic element that comprises: at least one clock terminal for receiving a clock signal; at least one input terminal for receiving an input signal; at least one output terminal for providing an output signal. The present invention also relates to: an apparatus that includes an electronic circuit having the features recited above; and a method of controlling power consumption of such an electronic circuit.

WO 01/48584 A1 "Microprocessor with digital power throttle" describes a scheme for digitally monitoring the power consumption of a microprocessor.

It is generally known in the art that the power consumption and dissipation requirements and criteria of modem electronic circuitry, such as an integrated circuit (IC) for example, is becoming more and more critical as their performance requirements, i.e. functionality, complexity, die size, clock speed etc., increase. Furthermore, the issue of power consumption is an extremely important factor in the design and operation of apparatus such as, for example, battery powered computers, multimedia devices and mobile communications.

Furthermore, it is well understood in the art that an IC that operates at high clock rates, and that has substantial portions of active electronic circuitry, generates substantial quantities of heat. This heat must somehow be removed away from the IC, and associated apparatus, in the quickest, most efficient and cost effective manner possible. The removal of this heat can, in some cases, become very complex and expensive, which again is well understood in the art.

Various techniques, circuitry and systems are known to those skilled in the art for manipulating the power consumption/dissipation of an IC. Many research efforts have been oriented to the design of circuits and techniques that achieve the desired performance criteria at acceptable power consumption levels. Since power consumption depends upon a number of different factors such as, for example: supply voltage; clock frequency; switching capacitance; and circuit switching activity, many different solutions have been proposed that try to minimize power consumption by reducing either one or a combination of such factors. Furthermore, leakage currents are becoming more of a factor in the power consumption budgets of ICs due to physical effects being experienced as changes occur in IC process technologies. As a direct result, solutions such as back biasing an IC's substrate or the use of MTCMOS technology have been proposed as efficient ways to control these leakage currents so as to manage an IC's power consumption.

Most of the effort in reducing IC power consumption is applied during the ICs design phase, where information on the power consumption of the IC is collected from simulations and statistical data. There are commercially available software based power consumption simulators that have gone some way to assist in the design of optimal circuits from the point of view of power consumption. But, these power consumption simulators optimize the power resources according to a series of fixed conditions, which is clearly disadvantageous.

In WO 01/48584 A1 a microprocessor is divided into various functional units that each has its own fixed 'power weight' that is encoded in a digital word: the power weight has to be determined by a calibration process. When the microprocessor runs a given program, the state of each functional unit is digitally monitored, i.e. it is either active or inactive. This monitoring unit neglects the power weights associated with the inactive functional units, but adds the power weights of the active functional units and compares the sum with a threshold that represents the expected maximum power consumption. If the sum is greater than the threshold, the instruction execution rate is decreased by lowering the clock frequency or by introducing bubbles in the instruction pipeline. If the sum is lower than the threshold, then no action is taken.

Some other examples of power consumption manipulation techniques involve: adjusting the frequency of a system clock to its optimum rate depending upon, among others, the data processing task(s) to be undertaken; adjusting the power supply in response to a given set of circumstances; or removing the supply of power altogether.

Some of the many and varied methods and apparatus for dissipating the heat produced by an IC that are known to those skilled in the art include, for example: heatsinks and liquid cooling. Such methods and techniques can very often be elaborate and expensive, both in monetary and spatial terms.

The scheme disclosed in WO 01/48584 A1 has some exemplary disadvantages. One such disadvantage is in that power consumption is monitored digitally. Further disadvantages are that: the power consumed by each of the functional units is not well represented by a 'fixed weight' solution, since power consumption is very much dependent upon the quantity and type of input data; and each of the functional units has to be calibrated so as to define their appropriate power weights.

It is an object of the present invention to provide an improved reduction of power consumption.

The invention is defined by the independent claims.

The dependant claims define advantageous embodiments of the invention.

The object is realized in that said electronic circuit further comprises: circuitry for monitoring the input and output signals to provide a control signal in response to the input and output signals, wherein the electronic circuit's power consumption is operatively controllable in response to the control signal.

According to one embodiment of a circuit of the present invention, the electronic circuit is capable of being controlled at a rate determined by the clock signal. Such an embodiment has the advantage that any changes in the clock rate are applied throughout the electronic circuit. Therefore, when power is required to be saved it can be carried out quickly and substantially.

According to another embodiment of a circuit of the present invention, the electronic circuit is capable of providing information relating to future power consumption. Knowing or predicting what future power consumption will, or is likely to, be can have obvious benefits when actively controlling power consumption. Decisions can be taken in advance of a known or likely 'about to happen' event that would, under normal circumstances, lead to increased power consumption.

Furthermore, according to another embodiment of a circuit of the present invention, the electronic circuit has the ability of having future power consumption being controllable in advance based upon past logical events. Knowing or predicting what future power consumption will, or is likely to, be based upon past events can also have obvious benefits when actively controlling power consumption. Once again, important, advance, power saving decisions can be taken relating to a known, or likely, 'about to happen' event.

Other features and advantages of the electronic circuit, apparatus and method of the present invention are capable of being elucidated by and from the accompanying exemplary drawings and description that follows.

In the drawings, which are intended as non-limiting examples of the principle of the present invention:

While the circuit of the present invention is described in reference to ICs, and in particular CMOS process technology ICs, it will be appreciated by those skilled in the art that its underlying principles are also applicable to other electronic circuits and IC process technologies.

The power consumption of digital ICs can be divided into two separate categories. The first category being, dynamic power consumption, and the second being, static power consumption.

Dynamic power consumption occurs during the logic state changes that take place within the digital circuitry of an IC. Static power consumption, on the other hand, occurs when the digital circuitry is in a steady, or quiescent, state. Dynamic power consumption is the dominant factor in the power consumption of charge controlled circuitry, such as CMOS, and occurs when the nodes of the various elements, which form the circuitry, change state due to an appropriate input stimulus.

In the interest of brevity, the use of the term "power" herein includes either actual power or a value, such as for example, current, voltage or another measurement that is proportional to, or indicative of, actual power.

Figure 1:
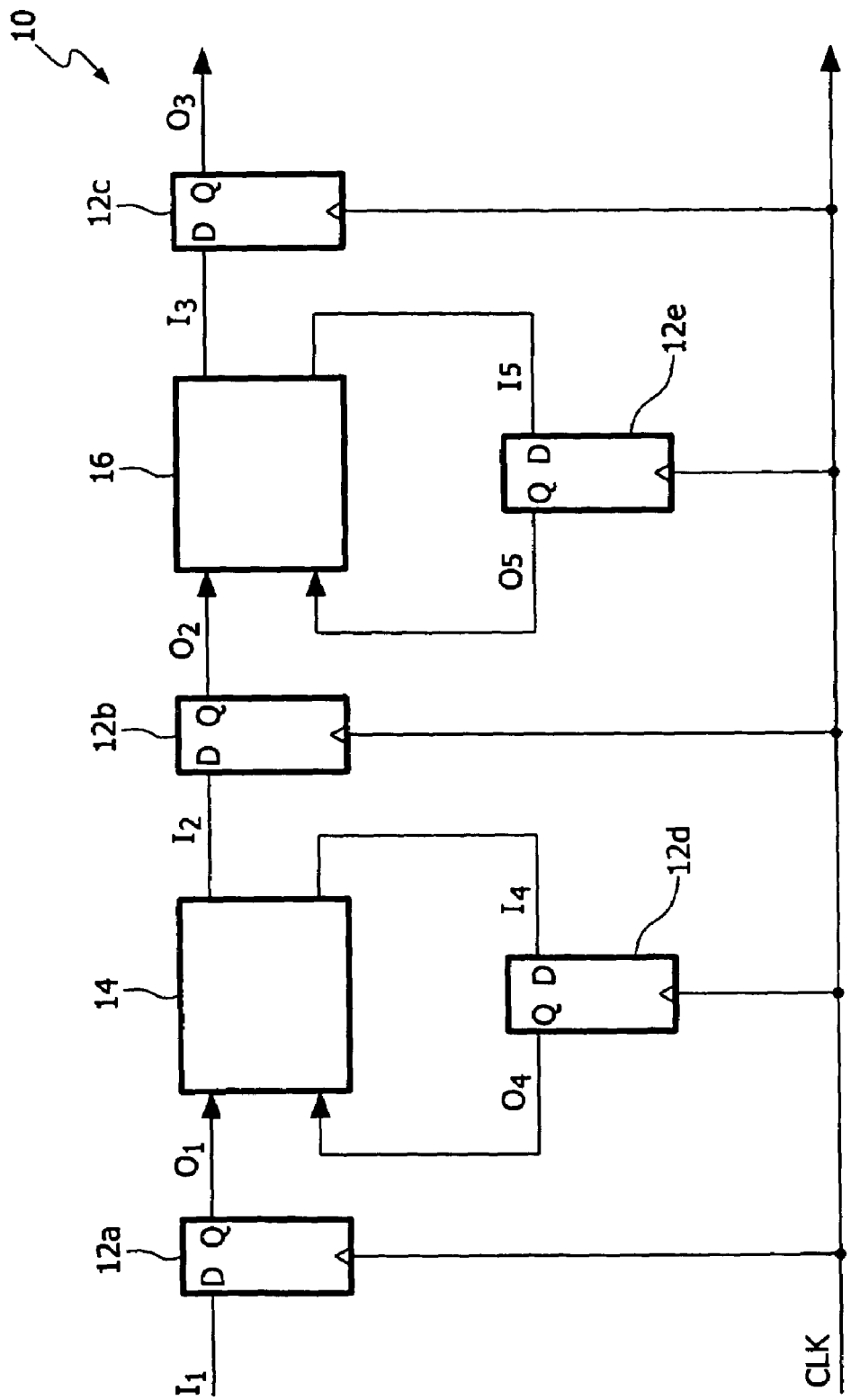
FIG. 1 illustrates exemplary state-of-the-art digital circuitry.

Referring to FIG. 1, this particular example of digital circuitry 10 comprises a series of D-type data latches, sometimes referred to as flip-flops or sequential logic, 12a-12e and two combinational logic blocks 14, 16.

It should be noted that for the purposes of describing the present invention, D-type flip-flops have been described and illustrated. However, the objects and advantages of the present invention, as will be understood by those skilled in the art, can also be achieved by the use of other types of logic, sequential or otherwise, such as, for example, J-K or S-R type flip-flops. Furthermore, the combinational logic blocks 14, 16 are intended as non-exhaustive illustrations of, for example, a processing logic block and a data path logic block.

Referring to FIG. 1, flip-flop 12a receives an input signal I1 and produces an appropriate output signal O1, which acts as a first input signal to the first logic block 14. Flip-flop 12b receives an input signal I2, which is a first output signal from the first logic block 14, and produces an appropriate output signal O2, which acts as a first input signal to the second logic block 16. Flip-flop 12c receives an input signal I3, which is a first output signal from the second logic block 16, and produces an appropriate output signal O3. Flip-flop 12d receives an input signal I4, which is a second output signal from the first logic block 14, and produces an appropriate output signal O4, which acts as a second input signal to the first logic block 14. Flip-flop 12e receives an input signal I5, which is a second output signal from the second logic block 16, and produces an appropriate output signal O5, which acts as a second input signal to the second logic block 16. Each of the flip-flops 12a-12e also receives a clock signal CLK, which is used to operatively gate input and output signals.

If the data contents of any of the flip-flops 12a-12e does not change, then the dynamic power consumption of the illustrated circuitry in FIG. 1, ignoring for the purposes of this illustration the clock signal CLK, will be zero, since there are no logic state changes. If however a state change does occur within one or more of the flip-flops 12a-12e and either one or both of the logic blocks 14, 16, or a respective portion thereof, due to an appropriate stimulus, then this state change propagates through the circuitry 10. Such propagation generates a certain amount of dynamic power consumption within the circuitry 10. Therefore, for a given clock cycle, power is consumed at a rate proportional to the number of state changes that takes place within the elements that comprise the circuitry 10. On average, the greater the number of elements that change state, i.e. the greater the 'activity' of the circuitry, the greater the power consumption. Therefore, knowing the number of elements that change state in a given clock cycle provides a direct correlation to the power consumption for that particular clock cycle. It should be noted that modern digital IC design methodologies and tools allow designers to know in advance, and with a great deal of certainty, what state changes are taking place, in response to input stimuli, and where such changes take place. Such advance knowledge is advantageous, as will be apparent from the following description.

If the power consumption, that is to say the activity, of a circuit is known in real time, it is then possible from this knowledge to operatively control the operation, and hence subsequent power consumption, of the circuitry 10 accordingly. Such control can include for example: a state change within elements of the circuitry 10; adjustment of the power supply voltage; adjustment of the IC's back-bias, i.e. substrate voltage; or adjustment of the frequency of the clock signal. Those skilled in the art will appreciate that the aforementioned illustrative control techniques, in addition to others, can be used in many varying degrees and combinations so as to reduce power consumption and performance. Thus, having the ability to monitor the activity of the circuitry 10 so as to enable the power consumption to be established is advantageous for increasing the overall performance of integrated circuits, as will be apparent from the following exemplary description and illustrations of the present invention.

If, in response to appropriate input stimuli, any of the flip-flops' 12 content changes, such changes will propagate through the circuitry 10 generating a certain amount of dynamic power consumption. Thereafter, but some time before the next clock CLK edge, the new logic state values I1-I5 at the inputs of the flip-flops 12 settle, thus preparing the flip-flops 12 for a new activity cycle. Accordingly, the power consumption of the circuitry 10 depends upon the number of flip-flops 12 that change state in each clock cycle. Thus, by operatively monitoring the activity at appropriate switching nodes, i.e. flip-flop input and output terminals, respectively D and Q, during each clock cycle, the power consumption of the circuitry 10 can be established. Appropriate switching nodes can readily be determined as part of the IC's design cycle. As mentioned earlier, modem design methodologies and tools allow designers to determine what data paths, and hence circuitry, will be active for known input stimuli. This advance knowledge can be used to strategically deploy monitors at the most appropriate nodes within the circuitry. This is especially advantageous when for example the characteristics of a logic block, for example, are known since the number of monitors can be kept to a minimum, thus reducing power and area otherwise taken up by monitors.

According to the present invention, electronic circuitry is added to the circuitry 10 so as to monitor, i.e. determine, its activity. Essentially, this monitoring is achieved by adding some extra circuitry to either all the flip-flops 12 or a certain portion thereof in order to monitor the activity of the circuitry 10.

Figure 2:
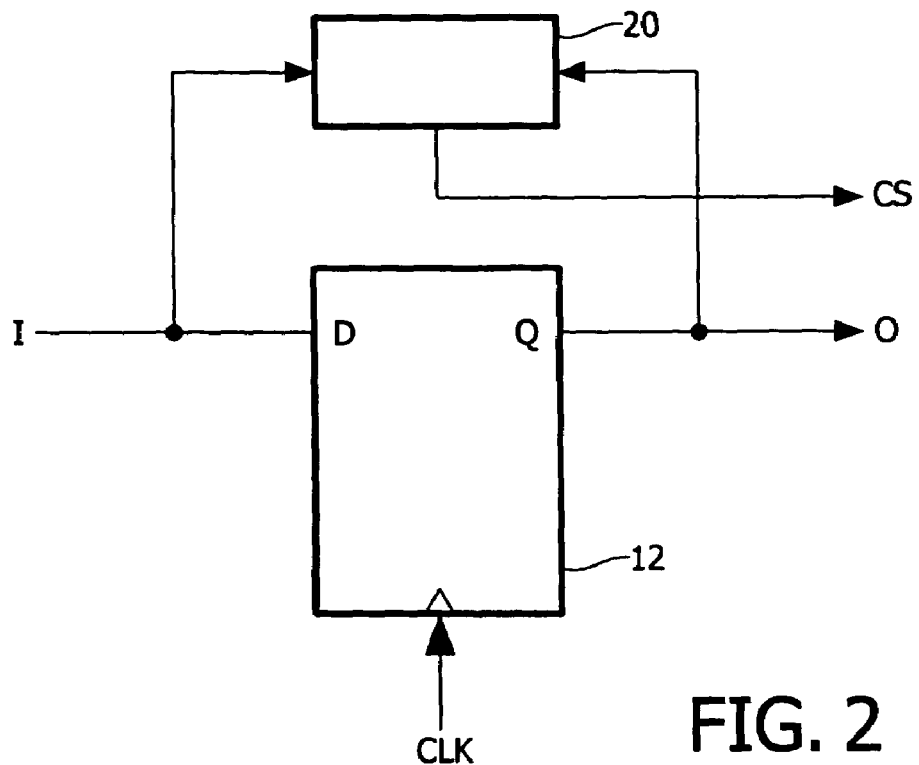
FIG. 2 illustrates a generic embodiment of electronic circuitry according to the present invention.

Referring to FIG. 2, the activity monitor 20 is the basic building block used for the purpose of monitoring the activity, and subsequent power consumption, of circuitry according to the present invention.

The flip-flop, or logic stage 12 has, in this particular example, an associated two input, one output, activity monitor 20. A first input of the activity monitor 20 is connected to the input D of the flip-flop 12 and a second input of the activity monitor 20 is connected to the output Q of the flip-flop 12. The activity monitor 20 produces an output signal CS which is determined by the state of the input and output signals I, O on the respective D and Q terminals of the flip-flop 12.

Figure 3:
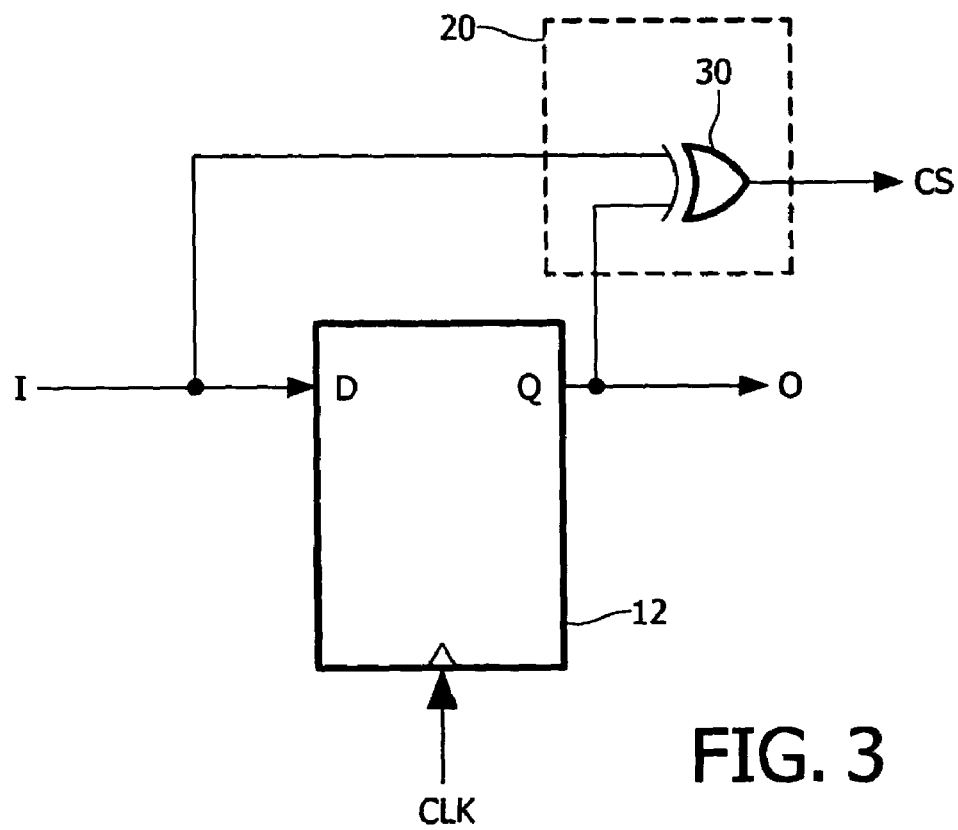
FIG. 3 illustrates another embodiment of electronic circuitry according to the present invention.

Referring to FIG. 3, one method of determining power consumption, as indicated by the number of switching flip-flops 12, would be to connect a two input XOR logic gate 30 between the input and output terminals D, Q, of each respective flip-flop 12 that is required to be monitored. In this particular embodiment, the flip-flop 12 only changes state when the value of the input signal I on the input terminal D of the flip-flop 12 does not equal the value of the output signal O on its corresponding output terminal Q.

Table 1 is a logic table that illustrates the state input and output values associated with the XOR logic gate activity monitor of FIG. 3.

TABLE 1

| I (D) | O (Q) | CS |
|---|---|---|
| 0 | 0 | 0 |
| 0 | 1 | 1 |
| 1 | 0 | 1 |
| 1 | 1 | 0 |

In the case where the logic states at the input and output terminals D, Q of the flip-flop 12 change such that they are not equal, i.e. I≠O, then the output signal CS from the XOR gate 30 is a logic 'high' or '1' state, which indicates a state change of the flip-flop 12 and hence circuit switching activity. Therefore, by counting the number of XOR output signals CS that have changed to a logic '1' state in each clock cycle provides the necessary information regarding the circuitry's switching activity. Since it is desirable to obtain this result in one clock cycle, the aforementioned counting would have to be carried out by adder circuitry, not illustrated. However, for circuitry with N flip-flops 12, where N is an integer, such an implementation based upon the illustration in FIG. 3 would require N two input XOR gates 30 and a digital adder, not illustrated, that has N one-bit inputs and $\log_2 N$ outputs. It will be appreciated by those skilled in the art that, where N may be large, this solution may not be as attractive as other solutions, such as will be described below.

Figure 4:
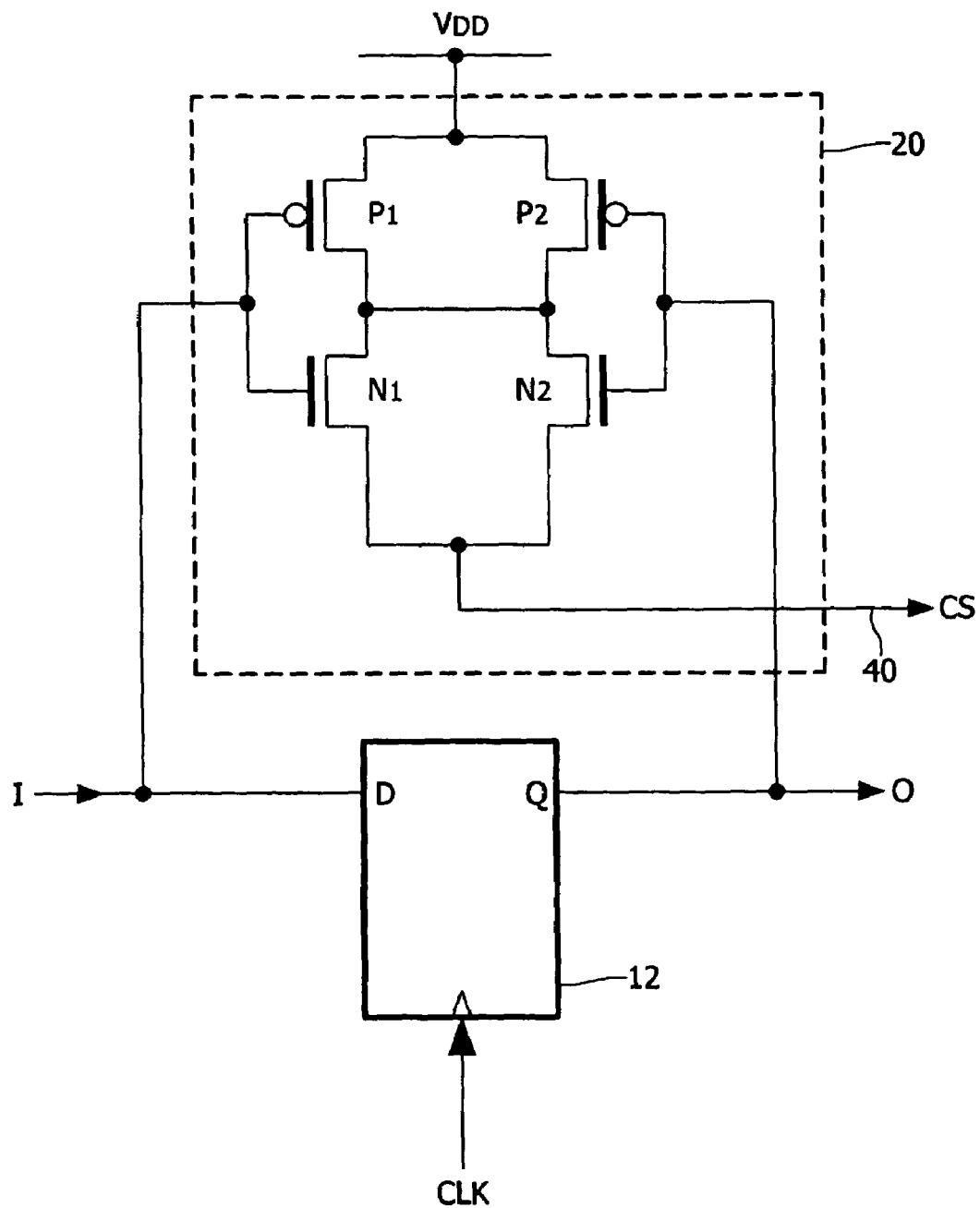
FIG. 4 illustrates yet another embodiment of electronic circuitry according to the present invention.

Referring to FIG. 4, the activity monitor 20 comprises two PMOS transistors P1, P2 and two NMOS transistors N1, N2.

The source terminals of transistors P1 and P2 are both connected to the positive power supply VDD while the source terminals of transistors N1 and N2 are both connected together to form the output terminal 40 of the activity monitor 20. In this particular exemplary illustration, the gate terminals of transistors P1 and N1 are both connected to the input terminal D of the flip-flop 12, while the gate terminals of transistors P2 and N2 are both connected to a corresponding output terminal Q of the flip-flop 12. The respective drain terminals of each of the four transistors P1, P2, N1 and N2 are all connected together.

In order for this activity monitor 20 to detect a state change in the flip-flop 12, the respective arrangement of the transistors P1, P2, N1, N2 has to be differential in nature.

Table 2 is a logic table that illustrates both the input and output logic states associated with the activity monitor of FIG. 4 and the conduction state of each of its four transistors.

TABLE 2

| I (D) | O (Q) | CS | P1 | P2 | N1 | N2 |
|---|---|---|---|---|---|---|
| 0 | 0 | 0 | On | On | Off | Off |
| 0 | 1 | 1 | On | Off | Off | On |
| 1 | 0 | 1 | Off | On | On | Off |
| 1 | 1 | 0 | Off | Off | On | On |

As can be seen, the arrangement and control of the transistors P1, P2, N1 and N2 illustrated in FIG. 4 and Table 2 is therefore a differential current source that is capable of detecting any logic state change, i.e. activity, of the flip-flop 12.

Therefore, when the input signals I, O to the flip-flop 12 are not equal, i.e. I≠O, only then will a pair of transistors, either P1 and N2 or P2 and N1, be conducting current. Conversely, when the input signals I, O to the flip-flop 12 are equal, i.e. I=O, none of the transistor pairs P1, N2 or P2, N1 will be conducting and in such a case, the output terminal 40 of the activity monitor 20 exhibits a high output impedance and therefore no current is supplied.

Figure 5:
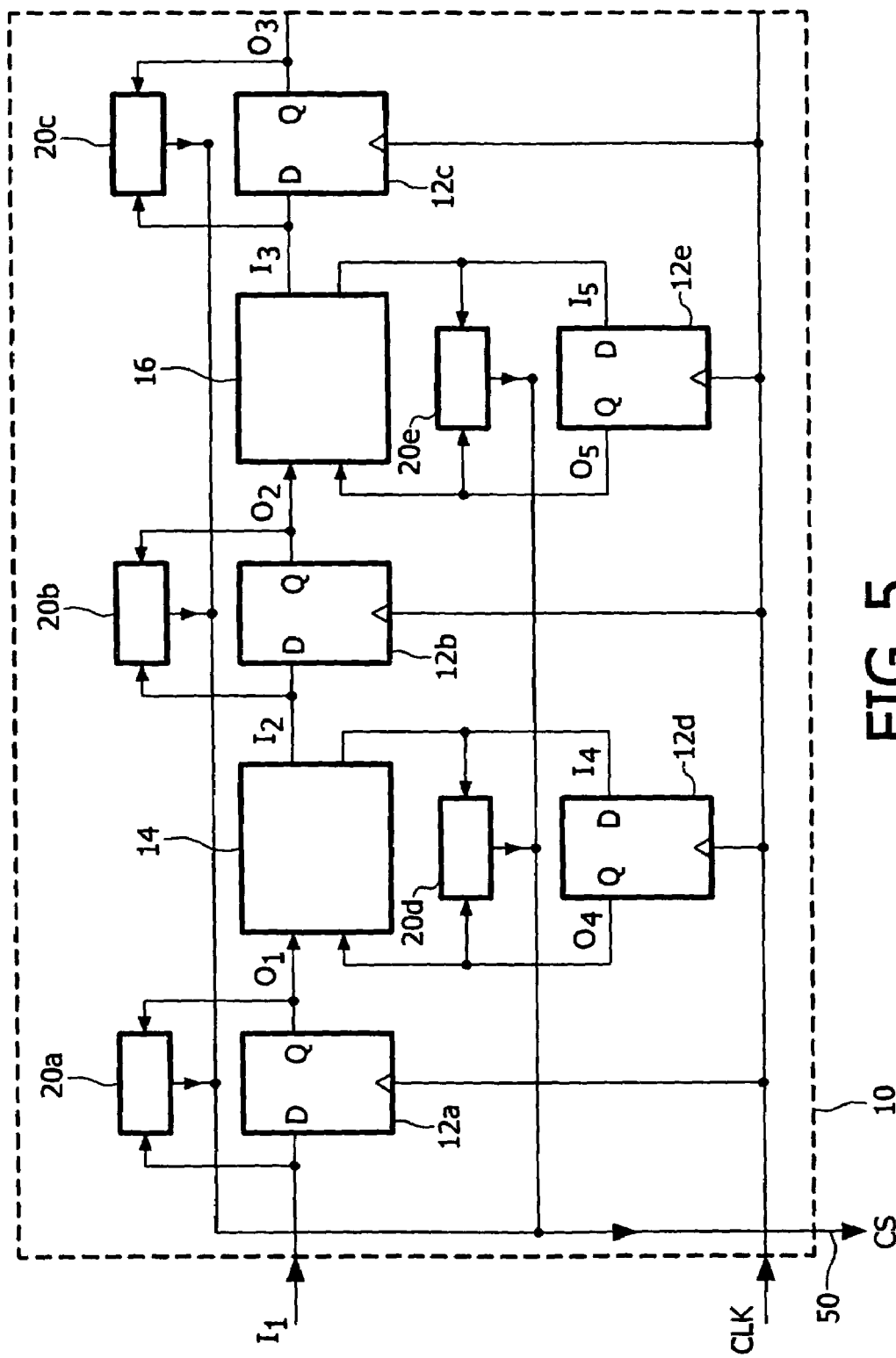
FIG. 5 illustrates the digital circuitry of FIG. 1 with the incorporation of electronic circuitry according to the present invention.

Referring to FIG. 5, each of the flip-flops 12a-12e have respective associated activity monitors 20a-20e operatively connected between their respective input and output terminals D, Q. Summing the currents produced by the individual activity monitors 20a-20e can be achieved by connecting their respective output terminals 40 together so as to produce a common output terminal 50, if so required.

Again, if a state change occurs within one or more of the flip-flops 12a-12e and either one or both of the logic blocks 14, 16, or a portion thereof, due to an appropriate input stimulus, then this state change will propagate through the circuitry 10. When any of the flip-flops 12a-12e change state, its respective activity monitor 20a-20e, due to its differential mode of operation, produces a respective current.

It will be appreciated by those skilled in the art that the amount of current produced by each activity monitor 20a-20e in response to a state change of an associated flip-flop 12a-20e is capable of being independently set and/or controlled to suit a particular application or need.

One method of setting the amount of current produced by an activity monitor 20 is by means of the aspect ratios, i.e. the ratio of gate width W to length L, of the transistors P1, P2, N1 and N2 which are determined during the design and fabrication stage. Therefore, if a particular activity monitor is expected to indicate the consumption of a relatively large amount of power, because it is associated with monitoring a large portion of circuitry, then it is possible to increase the amount of the current delivered by this activity monitor by adjusting the aspect ratio, typically just the width W, of one or more of its transistors P1, P2, N1 and N2. One possible application where 'wider' transistors P1, P2, N1 and N2 could be employed would be in connection with the monitoring the switching activity of the clock signal CLK. This can be achieved by adding a dummy flip-flop, not illustrated, whose nQ output, i.e. its inverse logic Q output, is connected to its D input and then monitoring its switching activity, i.e. power consumption, which one would typically expect to be high.

One method of controlling the amount of current produced by an activity monitor 20 is by operatively switching in or out additional transistors, not illustrated, that are connected in parallel with the principal transistors P1, P2, N1 and N2. It will be appreciated by those skilled in the art that many techniques may be employed to set and/or control the current produced by individual, or groups of, transistors, P1, P2, N1 and N2. Having the ability to set and/or control the current produced by an activity monitor 20 has advantages. One such advantage is that an activity monitor can have its current output weighted to, for example, the: functionality; size; and/or power consumption, etc; of an associated logic block. Another advantage is that the current from an activity monitor 20 can be set/controlled to overcome parasitic effects associated with its output path 50.

The speed of operation/response of an activity monitor 20 is only limited by the time required for its output current to charge any capacitance, parasitic or otherwise, associated with the current path. If such a capacitance is large, due, for example to the length of the current path then one or more current mirrors, not illustrated, may be operatively deployed so as to counteract such a capacitance and hence increase speed/response of operation. This alternative method of overcoming parasitic, i.e. predominantly capacitive, effects can be used either instead of or in addition to the methods of setting and/or controlling the current from an activity monitor 20. One advantage of using an amplifier, such as a current mirror, instead of controlling the current from a series of activity monitors 20, is that the aspect ratios of all the transistors P1, P2, N1 and N2 can be kept to a minimum. On a flip-flop by flip-flop basis, this helps to conserve area and power consumption and dissipation. An advantage, according to the present invention, of constructing an activity monitor using four minimum size transistors can be highlighted as follows. Typically, each D-Type flip-flop is itself constructed from approximately 30 transistors. The area overhead of including a four-transistor activity monitor 20 into a typical D-type flip-flop is therefore 4/30=13.3%, which in itself is not too much of a burden. However, the number of extra transistors included in the majority of applications of an IC design in which activity monitors 20 would typically be used would be in the order of a fraction of the total number of transistors that make up the IC.

Having produced a current from one or more of the activity monitors 20a-20e in response to switching activity, it is now possible to convert it to a voltage, if desired, by the use of a current-to-voltage, I/V, transducer.

Figure 6A:
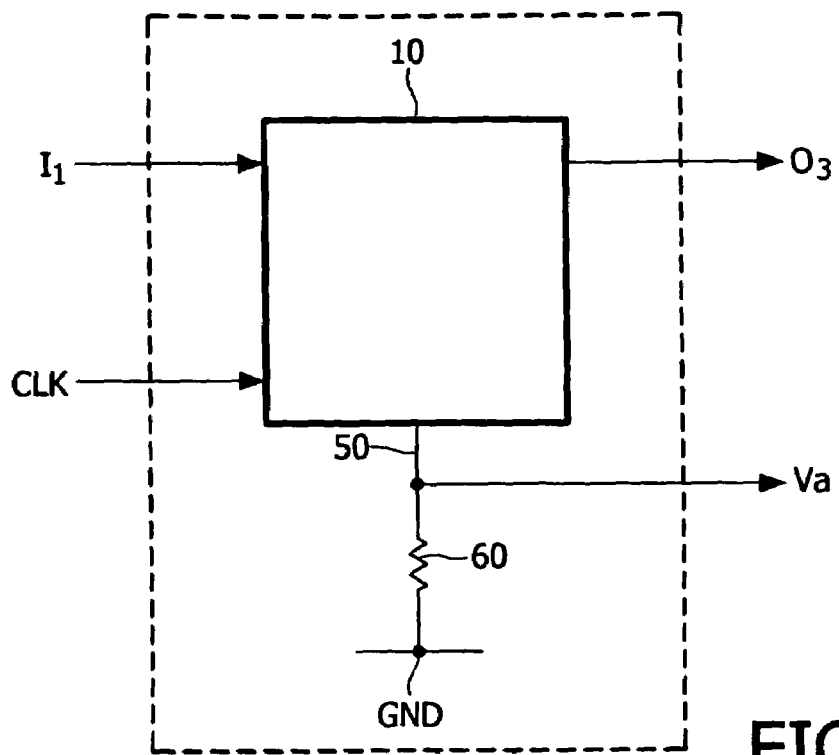
FIGS. 6a and 6b illustrate prior art transconductors.

Referring to FIG. 6a, the output terminal 50 of the circuitry 10 is connected to the negative supply rail GND via a resistive element such as a resistor 60, as illustrated, or alternatively an NMOS transistor operating in its linear region, not illustrated. Current flows to the negative supply rail GND via the resistor 60 which produces an output voltage Va across the resistor 60 that is proportional to the current from the activity monitors 20a-20e.

Figure 6B:
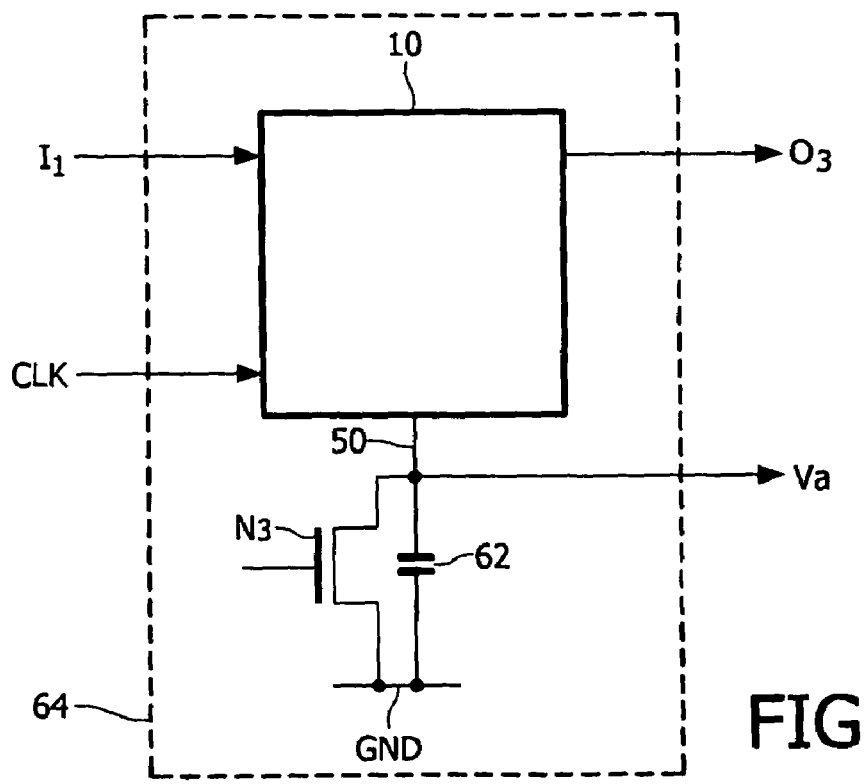

Referring now to FIG. 6b, the output terminal 50 of the circuitry 10 is connected to the negative supply rail GND via a capacitor 62. Also illustrated in FIG. 6b is an NMOS transistor N3 that is connected in parallel with the capacitor 62. This transistor N3 acts as a switch that is operatively controlled to discharge, i.e. to reset or initialize, the capacitor 62. Assuming the switch N3 is open, current flowing from the activity monitors 20a-20e integrates and charges the capacitor 62, which results in an output voltage Va across the capacitor 62 that is proportional to the total amount of current sourced from the activity monitors 20a-20e. As soon as the switch N3 is operatively closed, both terminals of the capacitor 62 are connected to the negative supply rail GND, thus discharging the capacitor 62 and typically this event would occur at the beginning of integration, which is usually at the beginning of each clock cycle. When the switch N3 operatively reopens and current flows from the activity monitors 20a-20e, the capacitor 62 again begins to charge up and produces an output voltage Va proportional to the current sourced by the activity monitors 20a-20e. The peak value of the output voltage Va reflects the energy consumed by the circuitry 10 during a given integration time, i.e. during the charging period of the capacitor 62. Transistor N3 may, for example, have its gate terminal connected so as to receive the clock signal CLK. In a preferred embodiment of the present invention, it is desirable to ensure that the output voltage Va is kept below a value which ensures that the transistors P1, P2, N1, N2 are, when conducting, operating in their respective saturation regions. Such operating conditions will be readily appreciated, and can therefore be subsequently tailored to a particular application, by those skilled in the art.

Referring now to FIG. 5, the outputs of the activity monitors 20a-20e perform an analog calculation of the Hamming distance between the present logic state of the circuitry 10 and its next logic state. As is known by those skilled in the art, this Hamming distance is correlated with the average power consumption of the circuitry 10.

One further advantage of the present invention is that the activity monitors 20a-20e also produce a current in response to switching transients that may occur at the terminals of the flip-flops 12. Therefore, the waveform of the resultant voltage Va at the output terminal 50 of the circuitry 10 also more accurately reflects its transient power consumption on a clock-by-clock basis.

Figure 7:
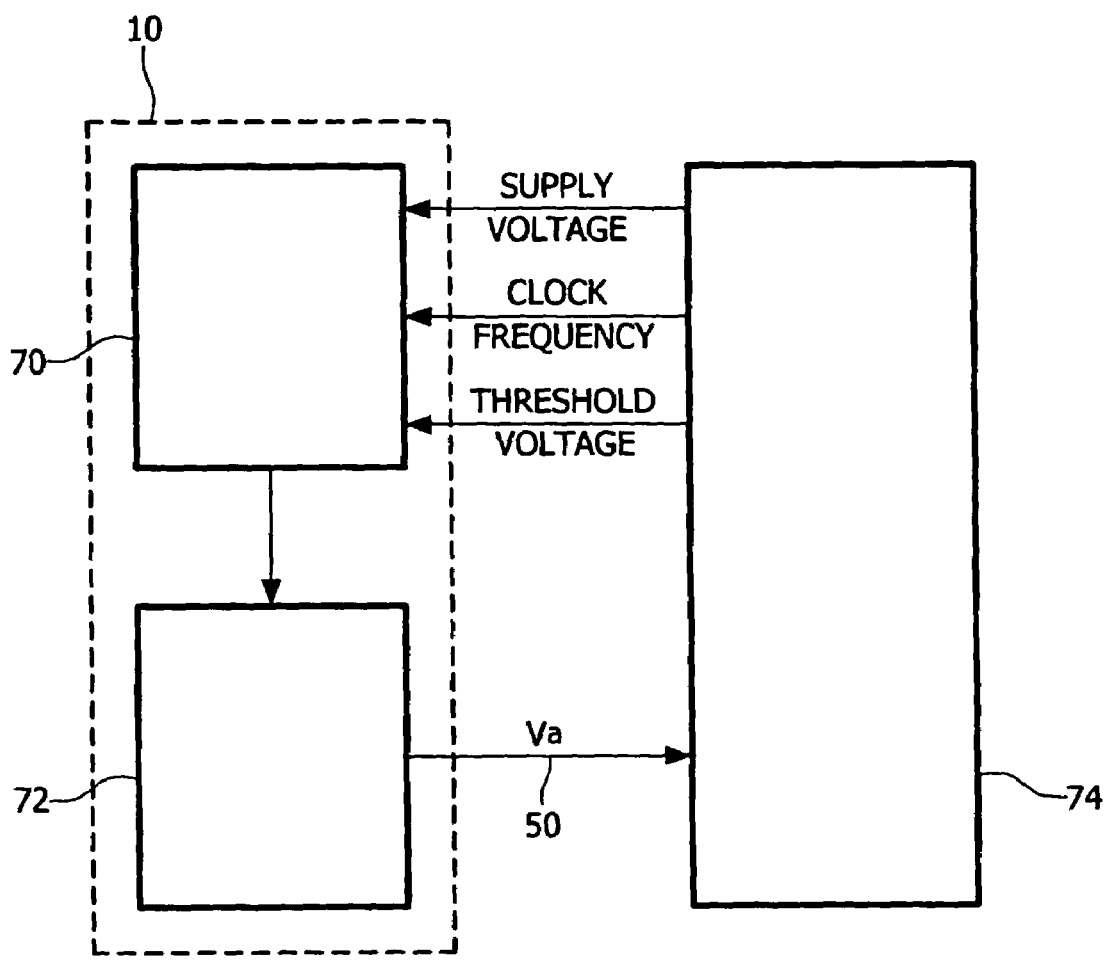
FIG. 7 illustrates a basic system block diagram of electronic circuitry according to the present invention.

The circuitry 10, as illustrated in FIG. 7, has for the purposes of ease of explanation and brevity been broken down into two distinct parts: logic 70 and activity monitor 72. The logic 70 respectively represents all of the exemplary flip-flops 12 and combinational logic 14, 16 within the respective previous figures while the activity monitor 72 respectively represents all of the exemplar individual monitors 20 within the respective previous figures. Also illustrated in FIG. 7 is a controller 74.

The controller 74 receives the output voltage Va from the activity monitor 72 and in response, operatively controls the logic 70, either in whole or in part, by altering, whether alone or the various combinations, for example, its: supply voltage; clock frequency; and/or threshold voltage(s).

It will be appreciated by those skilled in the art that the block diagram illustrated in FIG. 7 could, in the case of a large IC, be replicated and distributed throughout various zones of the IC. For example, the logic 70 could have three distinct elements: processing; memory; input/output, wherein each of these three elements could have its own dedicated logic, activity monitor and/or controller. Having disclosed such a variation, other such combinations are easily imaginable and can therefore be adapted to meet the individual specific needs as required.

Other advantages of the present invention that will also be appreciated by those skilled in the art relate to power consumption forecasting. Due to the operation of the flip-flops 12, the output signal Va of each of the respective activity monitors 20 gives a measure of a circuit's real power consumption for each clock period. Each output signal Va contains two pieces of useful information. Firstly, it provides information regarding the past, i.e. how many state changes in the associated flip-flops have occurred in the present clock period and secondly, it provides information regarding the future, i.e. how many state changes in the associated flip-flops will be produced in the next clock period. Therefore, the output signal Va of the activity monitor actually predicts the future power consumption, i.e. switching activity, of its associated circuitry before it occurs. Furthermore, situations where a predetermined power level is, is likely to, or has, been exceeded can be detected. From such predictions it is possible to react in advance and initiate some form of strategy in order to increase performance.

Another advantage associated with the present invention stems from the fact that the output signal Va of an activity monitor 20 provides a waveform profile, or signature, of the power consumption, including glitching activity, for a given stream of input data. Although not illustrated, such a waveform profile or signature may then be analyzed, either in real time or otherwise, so as to determine for example any abnormalities which do not change the logic behavior of the circuitry in question but that can be potentially dangerous. Furthermore, by recording the output signal Va of an activity monitor such as, for example, the execution of given instructions or a routines, and averaging this data, a measure of the average power consumption associated with this event can be established. This information can then be used by a high level controller 74, for example, to control the circuitry either with hardware and/or software according to the circumstances. Hardware control could typically take the form of switching in and/or out different circuits, or portions thereof. Software control could typically take the form of executing alternative instructions or routines.

Figure 8:
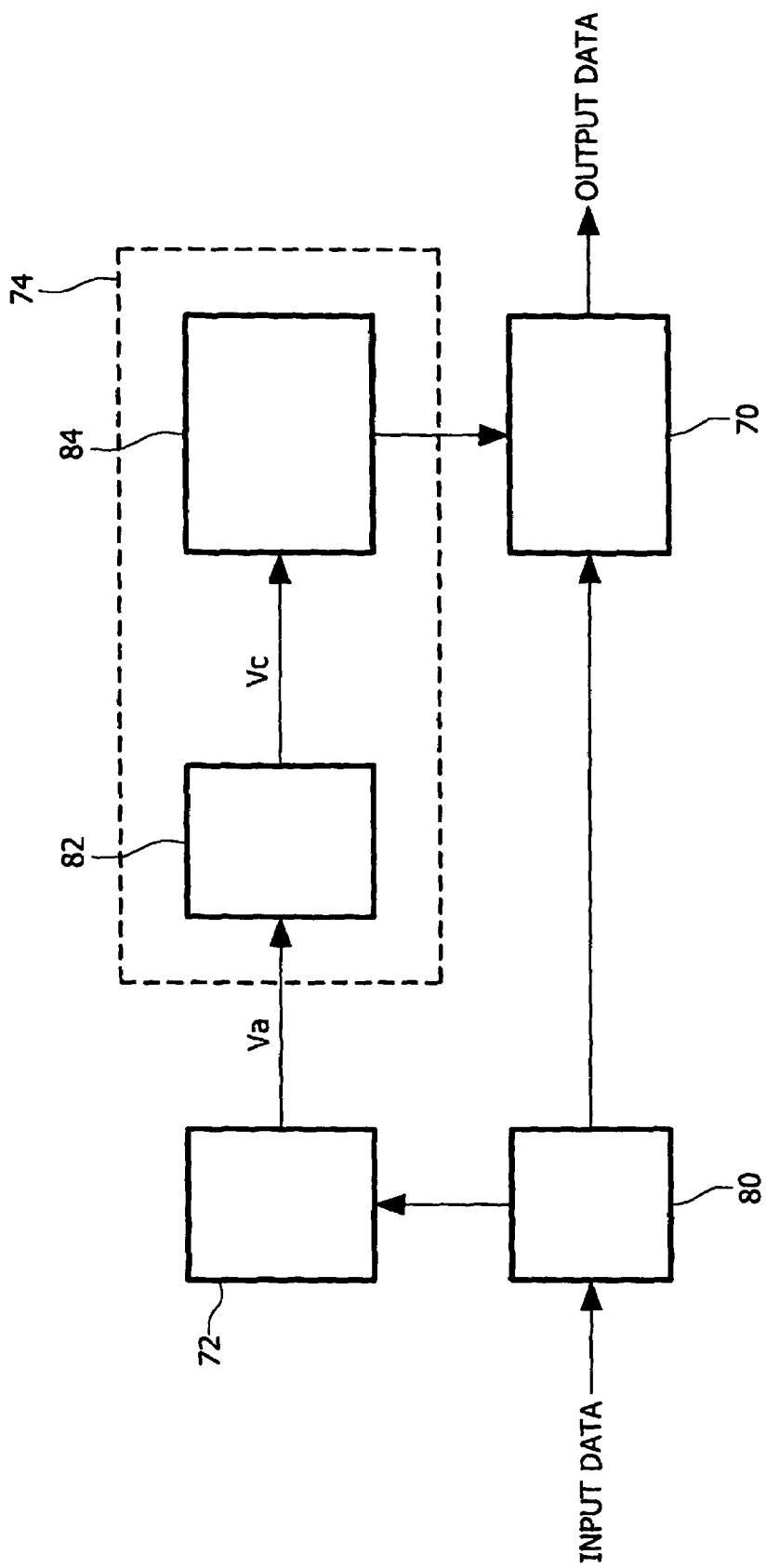
FIG. 8 illustrates a block diagram of electronic circuitry used for voltage control according to the present invention.

Referring to FIG. 8, the block diagram illustrates a buffer 80; an activity monitor 72; a sample and hold amplifier 82; a voltage regulator 84; and logic 70.

The input data is buffered in a FIFO memory 80, which has operative connections to the activity monitor 72 and the logic 70. The FIFO memory receives input data streams before they are applied to the logic circuitry 70. In this embodiment, the purpose of the FIFO memory 80 is to adapt the average rate of input data to the processing speed of the logic 70. Although not illustrated, each flip-flop, i.e. shift register, in the FIFO memory 80 could also include its own activity monitor 20, so that, by monitoring the FIFO memory 80 activity, information can be obtained regarding the future activity of the logic 70, which for controlling and monitoring power consumption, is advantageous.

During each clock period, the output signal Va from the activity monitor 72 is sampled and rescaled to a more appropriate value by a sample and hold amplifier 82. The output signal Vc of the amplifier 82 is applied to the power supply regulator 84, which in response, operatively increases or reduces the supply voltage VDD of the logic 70 in accordance with the signal Vc.

Figure 9:
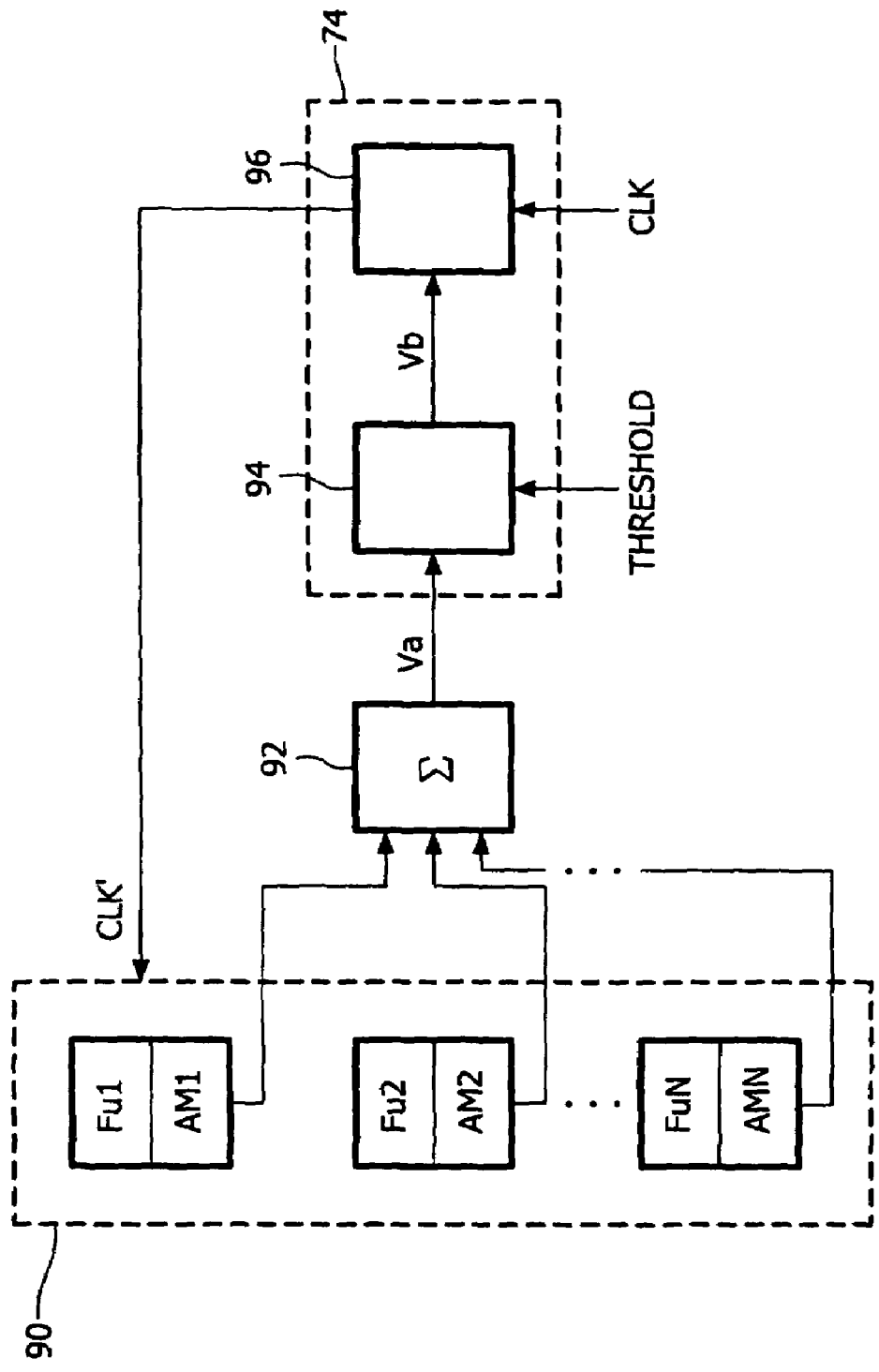
FIG. 9 illustrates a block diagram of electronic circuitry used for the frequency control according to the present invention.

The block diagram of FIG. 9 comprises: a microprocessor 90; a summing circuit 92; a comparator 94 and a frequency regulator 96.

The microprocessor further comprises a series of functional units $FU_1$-$FU_N$, where N is an integer. These functional units represent for example an ALU; a multiplier; a shifter; a decoder etc., and each of these functional units has, in this particular example, its own corresponding activity monitor $AM_1$-$AM_N$. The output signals of each of the activity monitors $AM_1$-$AM_N$, which is a measure of activity of each of its corresponding functional units over a given period of time, are fed into the summing circuit 92. The summing circuit 92 produces an output signal Va that corresponds to the sum of all of the input signals from the activity monitors. The comparator receives a 'threshold' reference signal together with the output signal Va of the summing circuit and the output signal Va from the summing circuit 92 is compared the threshold reference signal. If the accumulated activity, represented by the voltage Va, during N, for example, clock cycles is greater than the threshold voltage signal then the comparators output voltage signal Vb changes state. This state change in the comparator 94 is detected by the frequency regulator 96, which correspondingly regulates the clock signal CLK' to the microprocessor in an operative manner so as to respond to the output signals of the activity monitors $AM_1$-$AM_N$.

Figure 10:
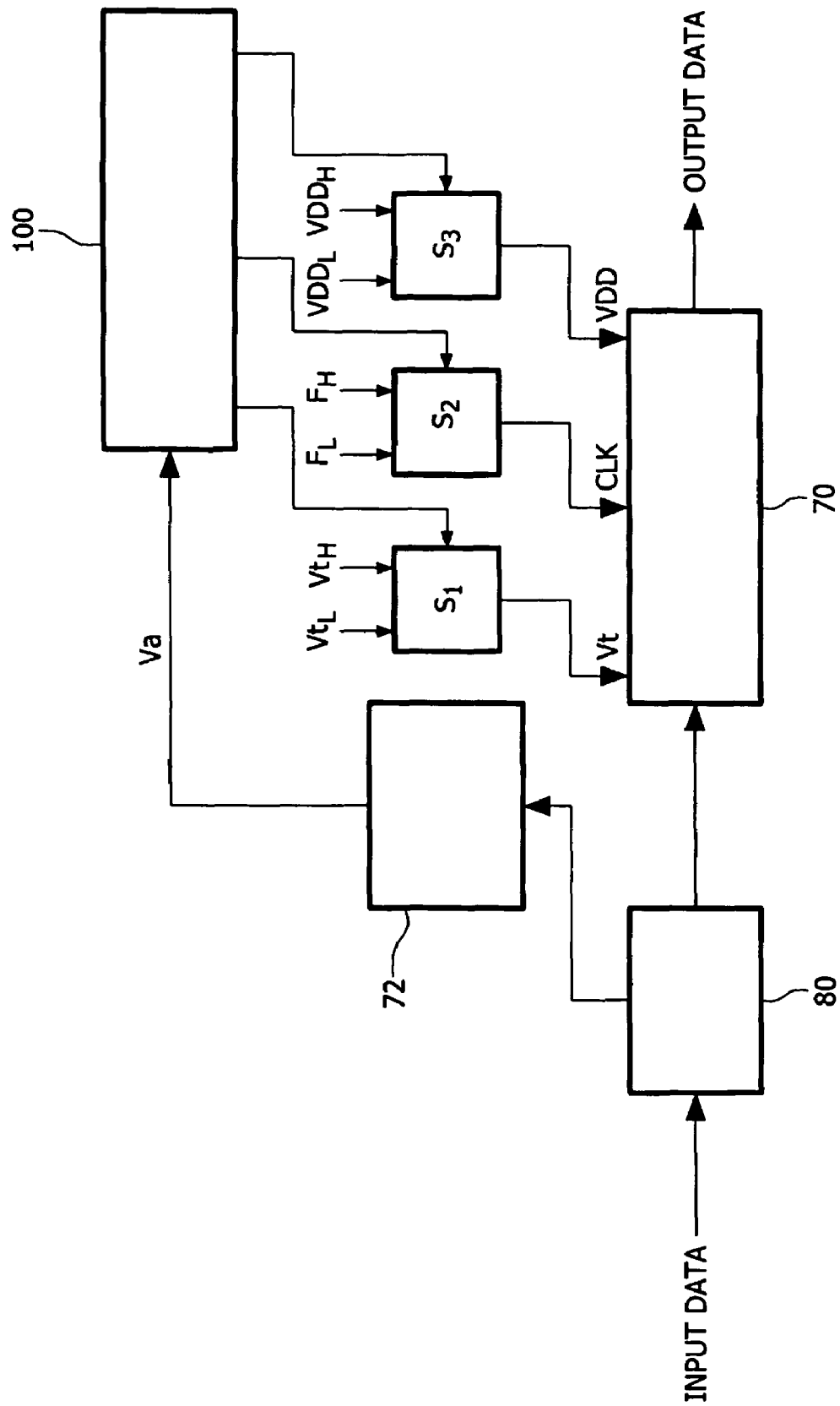
FIG. 10 illustrates a generic block diagram of electronic circuitry used for the control of power consumption according to the present invention.

The block diagram of FIG. 10 illustrates a buffer 80; an activity monitor 72; an analogue-to-digital converter, including a look-up-table, 100; three switches S1-S3; and logic 70.

The input data is buffered in a FIFO memory 80, which has operative connections to the activity monitor 72 and the logic 70. The output signal Va from the activity monitor 72 is fed into an analogue-to-digital converter 100, which also includes a look-up-table, and converted into a digital word. This digital word is then input to the look-up-table which determines the best possible state condition of each of the switches S1, S2 and S3. In this particular illustrative example, each switch S1, S2 and S3 respectively feeds the logic 70 with two possible values: transistor threshold voltage high $Vt_H$ or transistor threshold voltage low $Vt_L$; clock frequency high $F_H$ or clock frequency low $F_L$; and supply voltage high $VDD_H$ or supply voltage low $VDD_L$. Therefore, according to the measured activity level Va and the contents of the look-up-table, the best combination of supply voltage, transistor threshold voltage and/or clock frequency can be selected via the switches S1-S3. Clearly, it will be apparent from the above description that any or all of the switches S1-S3 could have more than two discrete levels as illustrated.

In summary, the activity monitor disclosed in the present invention can be useful in applications where, for example, it is not convenient, or possible, to fix the electronic circuit's working conditions for average power consumption, which can be largely determined from simulation and/or statistical analysis. In such a case, the subject matter of the present invention, which uses a control scheme to adapt these conditions to the changing consumption, becomes advantageous. Furthermore, power consumption and the computational needs of the circuitry often strongly depends on the input data or on the algorithm being executed, and in such a case, some type of trade between speed and power is also advantageous.

According to the present invention, the activity monitor's output signal provides information relating to the power consumption during every clock cycle or N, where N is an integer, clock cycles. The information that can be obtained is twofold in certain circumstances. Due to the nature of sequential logic, information can be gathered from the past and towards the future. From the past, such information relates to the number of logic state changes in the flip-flop inputs that have been produced during the present clock cycle, or past N clock cycles. Such information is useful and advantageous since it allows a prediction to be made regarding future power consumption. To the future, such information relates to the number of logic state changes at the flip-flop outputs will be produced during the next clock period. This ability to be able to prediction future logic changes is advantageous when improving power consumption, performance or both.

It should be noted that the above-mentioned embodiments illustrate rather than limit the invention, and that those skilled in the art will be capable of designing many alternative embodiments without departing from the scope of the appended claims. In the claims, any reference signs placed between parentheses shall not be construed as limiting the claim. The word "comprising", "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. An electronic circuit comprising:
   a plurality of sequential logic elements, each one of the sequential logic elements comprising:
      at least one clock terminal for receiving a clock signal;
      at least one input terminal for receiving an input signal;
      at least one output terminal for providing an output signal;
   circuitry, for monitoring said input and output signals of respective sequential logic elements to provide respective control signals in response to said input and output signals of said respective sequential logic elements; and
   means for summing said respective control signals to form a summed control signal, wherein an analog level of said summed control signal is the sum of analog levels of said respective control signals, and controlling a power consumption of the electronic circuit in response to said summed control signal.

2. An electronic circuit as claimed in claim 1, wherein said electronic circuit is capable of being controlled at a rate determined by the clock signal.

3. An electronic circuit as claimed in claim 1, wherein said electronic circuit is capable of providing information relating to future power consumption.

4. An electronic circuit as claimed in claim 1, wherein future power consumption is controllable in advance based upon past logical events.

5. An apparatus that includes an electronic circuit as claimed in claim 1.

6. A method of controlling power consumption of an electronic circuit that includes a plurality of sequential logic elements, each one of the sequential logic elements comprising:
   at least one clock terminal for receiving a clock signal,
   at least one input terminal for receiving an input signal, and
   at least one output terminal for providing an output signal,
   the method comprising the steps of:
   monitoring said input and output signals of respective sequential logic elements to provide respective control signals in response to said input and output signals of said respective sequential logic elements; and
   summing said respective control signals to form a summed control signal, wherein an analog level of said summed control signal is the sum of said respective control signals, and controlling a power consumption of the electronic circuit in response to said summed control signal.

* * * * *